United States Patent [19]
La Rue

[11] Patent Number: 6,081,430
[45] Date of Patent: Jun. 27, 2000

[54] HIGH-SPEED BACKPLANE

[76] Inventor: George Sterling La Rue, 15410 NE. 6th Pl., Bellevue, Wash. 98007

[21] Appl. No.: 09/072,792

[22] Filed: May 5, 1998

Related U.S. Application Data

[60] Provisional application No. 60/045,711, May 6, 1997.
[51] Int. Cl.[7] .................................................. H01K 12/16
[52] U.S. Cl. ......................... 361/788; 361/733; 361/803; 361/228.7; 361/229; 439/61; 439/65
[58] Field of Search .................................... 361/788, 733, 361/803, 748, 752; 439/61, 65, 620; 364/228.7, 229, 231.9, 240

[56] References Cited

U.S. PATENT DOCUMENTS

| | | | |
|---|---|---|---|
| 4,697,858 | 10/1987 | Balakrishnan | 439/61 |
| 5,128,832 | 7/1992 | Lawrence | 361/775 |
| 5,158,470 | 10/1992 | Zarreii | 439/79 |
| 5,696,667 | 12/1997 | Berding | 361/788 |

*Primary Examiner*—Leo P. Picard
*Assistant Examiner*—David Foster

[57] ABSTRACT

A backplane consisting of segmented bus lines on a mother board with loop-through connections to active transceivers mounted on connectors to daughter boards. The transceivers isolate the interconnect to the daughter boards from the bus lines. The loop-through transmission line on the connectors preserves the impedance of the bus lines and allows the interconnect stub to the transceivers to be short, minimizing reflections and enabling high-speed backplane operation. The connectors are removable from the motherboard for repair.

6 Claims, 10 Drawing Sheets

HIGH-SPEED BACKPLANE

CROSS REFERENCE

This application claims the benefit of U.S. provisional application Ser. No. 60/045,711, filed May 6, 1997. The subject matter of provisional application Ser. No. 60/045,711 is incorporated herein by reference.

FIELD OF THE INVENTION

This invention relates to the interconnection of circuits, such as between printed circuit boards, where high data rate communication between circuit boards is required. More particularly, the invention relates to high-speed backplanes where electrical components are included on the connectors.

BACKGROUND OF THE INVENTION

A backplane is used to connect power, data and control lines to many removable circuit boards. Conventionally the backplane consists of a printed circuit board (mother board) with many parallel lines each connected to many card connectors. The removable boards (daughter boards) plug into these connectors perpendicular to the motherboard. Each board has transmitters and/or receivers connected to appropriate lines to allow communication with other boards. A protocol is used to prevent more than one board transmitting on the same line at the same time.

As systems increase in speed, the communication data rate between boards also needs to increase. To increase throughput, backplanes must either operate at higher data rates or else have more parallel lines, or both. Crosstalk, noise, signal integrity and the reliability of the connectors thus becomes issues. At higher frequencies, interconnects must be modeled as transmission lines. Any mismatches in line impedance causes reflections which degrade signal quality. Speed can be increased by carefully controlling and matching impedances and by shortening any unterminated stubs.

Performance of backplanes must continue to increase in order for systems to take advantage of the continuing increase in performance of integrated circuits.

Conventional Backplane

Figure 1:
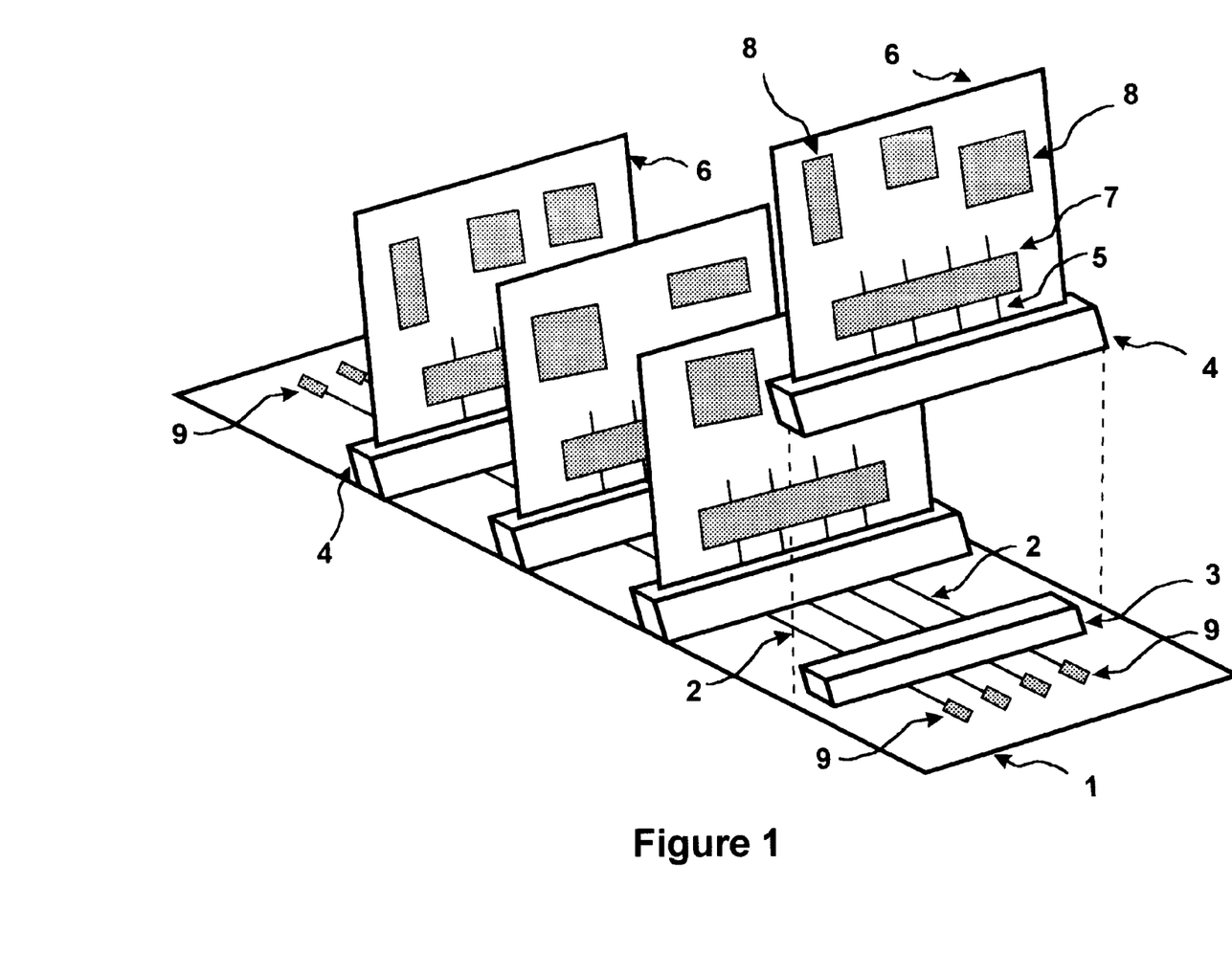
FIG. 1 is a perspective drawing of a conventional backplane.

A common backplane system is shown in FIG. 1 of the accompanying drawings. It consists of connectors 3 mounted on a mother board 1 spaced about at regular intervals. The connectors 3 are wired together with multiple bus lines 2 on the motherboard. The bus lines 2 normally have terminations 9 placed at each of their ends. The mother board connectors 3 have mating connectors 4 mounted on each daughter board 6. Each daughter board 6 contains numerous circuits and components 8 to perform desired functions. Bus transceivers 7 are connected to the mating connectors 4 by traces 5 on the daughter boards. Components 8 on the daughter board communicate to other daughter boards through the transceivers 7 which drive and detect signals on the backplane bus lines 2.

Figure 2:
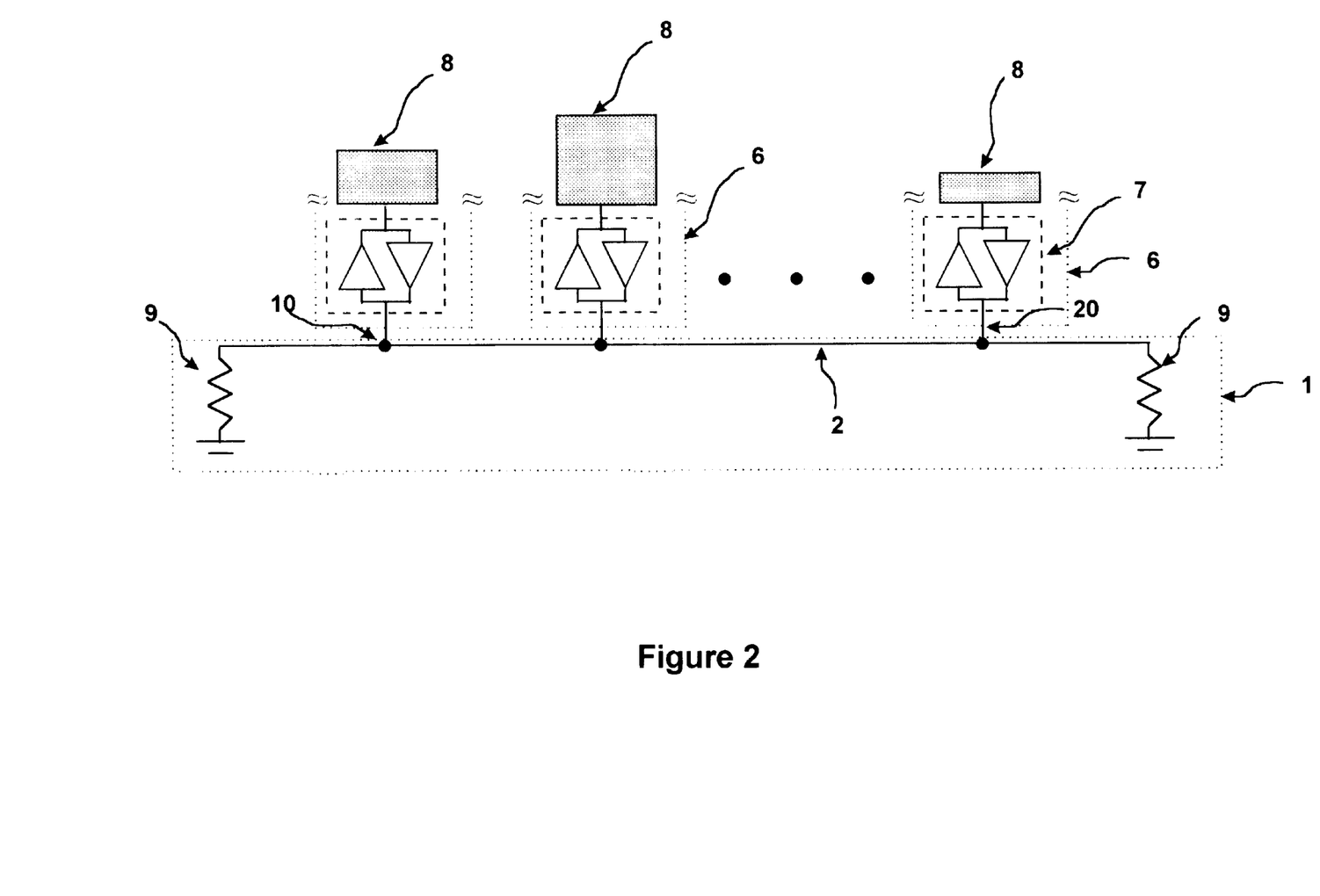
FIG. 2 is a schematic of the conventional backplane in FIG. 1.

FIG. 2 shows a schematic of the conventional backplane architecture. Only one line is shown. A controlled impedance line 2 runs the length of the motherboard 1 and is terminated at each end by termination 9. Each stub 20 consists of the electrical path between the connection to the transceiver 7 and the connection to the bus line 2. The stub 20 includes the connectors 4 on the motherboard, the connector 3 on the daughter board 6 and the trace 5 between the transceiver and the connector 4 on the daughter board. The transceivers 7 relay signals between the components 8 on the daughter board 6 and the bus line 2.

The stubs 20 are connected at regular intervals to the motherboard transmission bus line 2. Reflections at each stub cause ringing and limit high-speed operation. Shortening the length of interconnect from the backplane to the transceivers on the daughter boards reduces reflections and allows higher speed operation There is a physical limit to how short these interconnects can be made, however One novel approach to shorten the interconnect is to imbed the transceiver in the connector as described by Zarreii (U.S. Pat. No. 5,118,300 Active Electrical Connector issued Jun. 2, 1992).

Active Backplane

Figure 3:
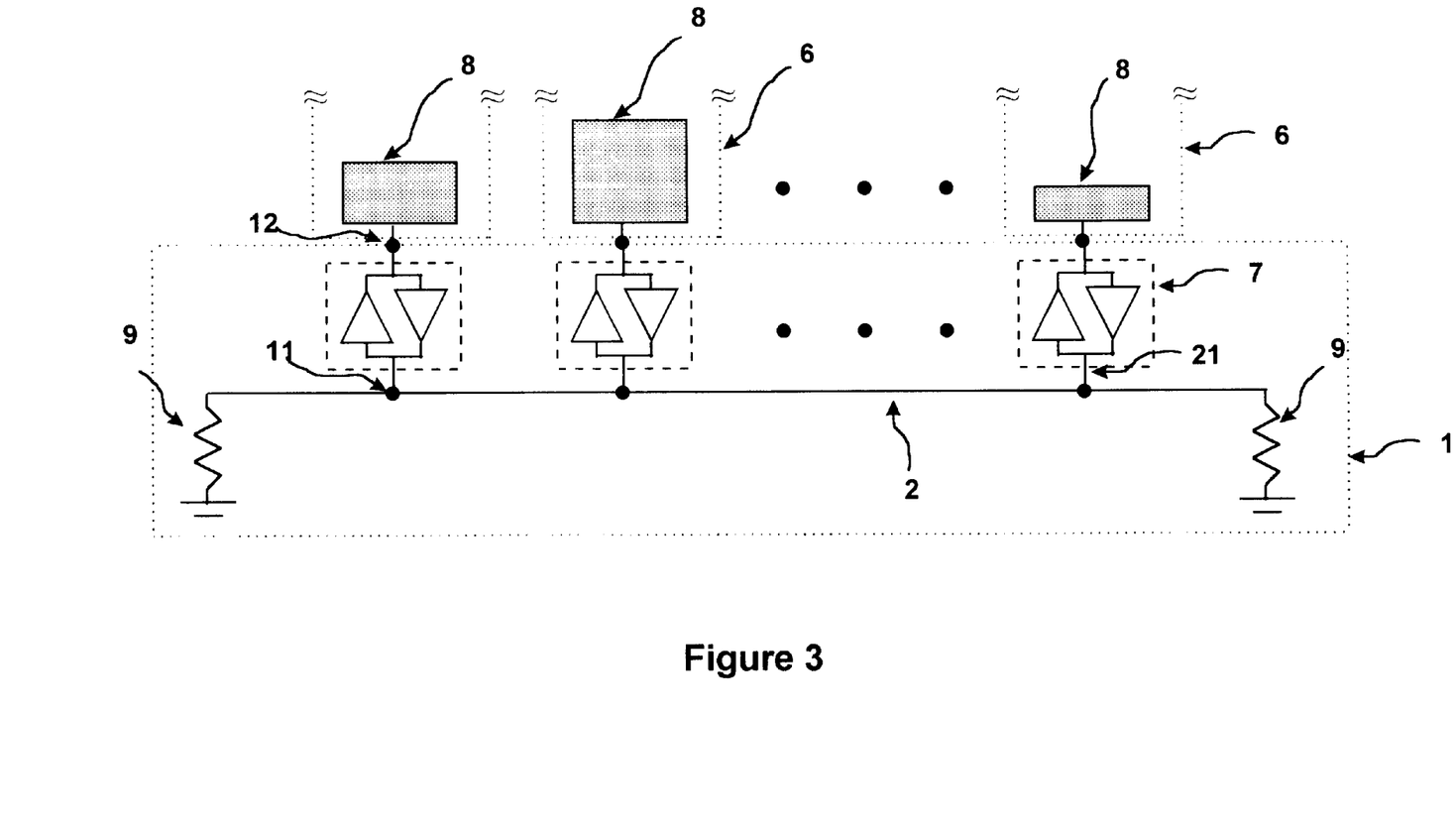
FIG. 3 is a schematic of the active backplane.

Balakrishnan (U.S. Pat. No. 4,697,858 Active Bus Backplane issued Oct. 6, 1987) describes a high-performance backplane that uses active transceivers mounted on the mother board. A schematic of this active backplane approach is shown in FIG. 3. Only one line is shown. A controlled impedance line 2 runs the length of the motherboard 1 and is terminated at each end by termination 9. The transceivers 7 are mounted on the motherboard 1 and connect to the controlled impedance line 2 with connections 11. The stubs 21 include interconnect on the transceiver package and on the motherboard between the connection 11 and the transceiver package The stubs can be made very short since the transceivers are mounted on the mother board. The packaging interconnect and the capacitance of the transceiver input become the limiting factors to the performance of this active backplane architecture. A transceiver 7 connects to the daughter board components 8 with contacts 12 between the connectors on the motherboard and the daughter board. The transceivers 7 mounted on the mother board isolate the signal path between the mother board and daughter boards from the bus line 2 removing the constraint that the length of the signal path between the transceiver 7 and the daughter board components needs to be very short. Only one removable contact 12 is in the path between the transceiver and the daughter board components easing the required precision of the controlled impedance of the connectors. The performance of this backplane is significantly higher that the conventional backplane. The major drawback to this approach is that there are active components on the backplane. If a component on the backplane fails then the motherboard must be replaced or repaired. Repairs are costly since extensive disassembly may be required.

SUMMARY OF THE INVENTION

A digital backplane is disclosed that includes: a mother circuit board containing signal bus line segments operable for conducting electrical signals; several connectors containing contact pins operable for electrically contacting the signal paths of a daughter board inserted into the connector, and also containing loop-through signal paths operable for conducting electrical signals between contacts with pairs of bus line segments on the mother board; many transceivers physically coupled to the connectors and each electrically connected between one of the loop-through signal paths on the connector and one of the contact pins on the connector, where the transceiver is operable for relaying electrical signals between a daughter board and a signal bus line. Each backplane bus line is formed from bus line segments on the mother board contacting with loop-through signal paths on the several connectors. The connectors can be easily removed and replaced for repairs.

The performance of the invention and that of active backplanes can be enhanced by compensating for the transceiver capacitance by increasing the impedance locally so the average line impedance matches the backplane line impedance, and by placing the active connectors at irregular electrical distances to eliminate coherent addition of reflections at transceiver nodes.

DETAILED DESCRIPTION OF THE INVENTION

Loop-Through Backplane

Figure 4:
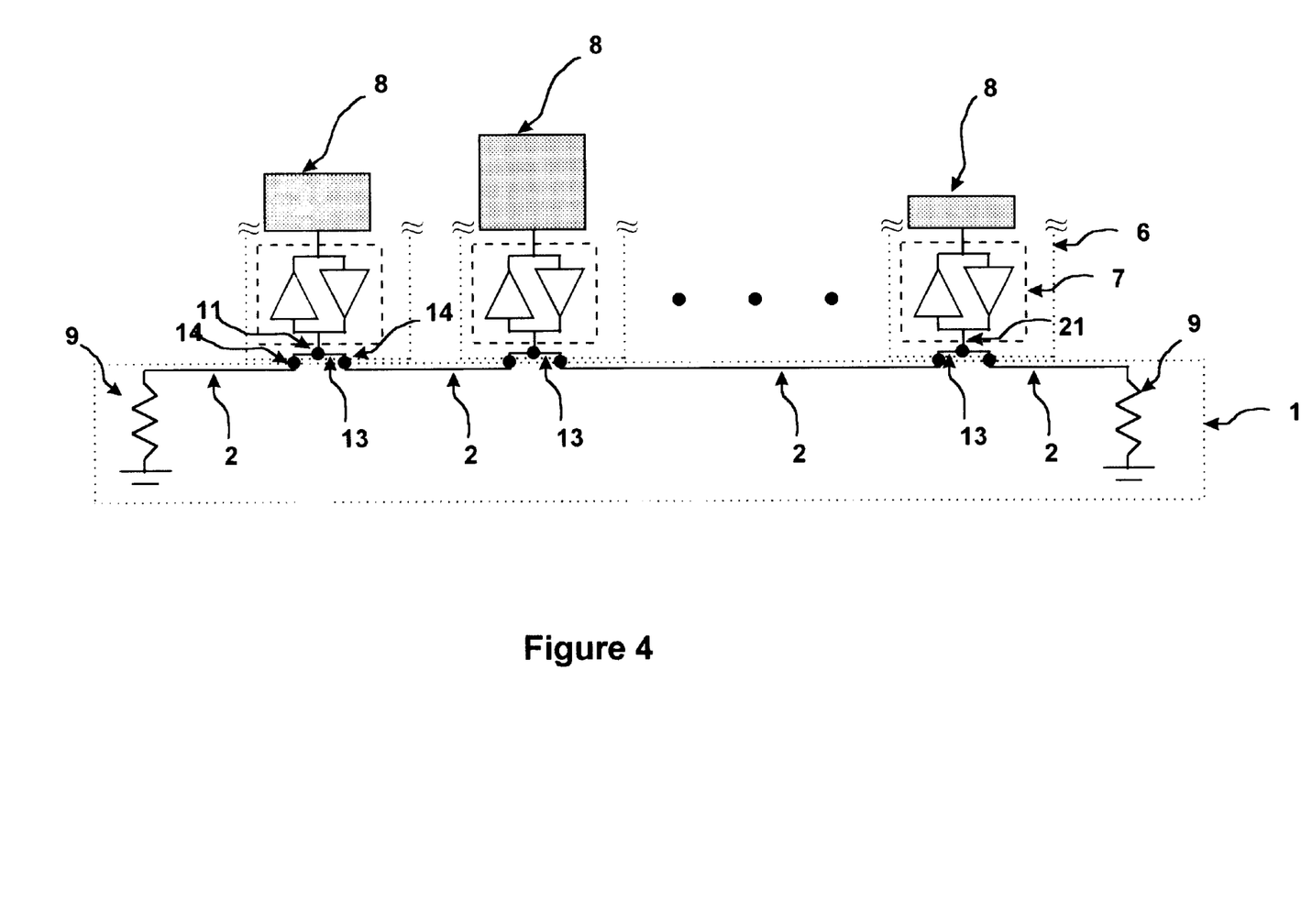
FIG. 4 is a schematic of the loop-through backplane.

A schematic of the loop-through backplane approach is shown in FIG. 4. Only one line is shown. The backplane consists of a mother board 1 with controlled impedance bus line segments 2 between several connectors. The two end segments are terminated by terminations 9. Each daughter board 6 contains a loop-through controlled impedance line 13 per bus line which contacts two different bus line segments at the connector contact points 14. The lines 13 are called loop-through because the transmission line starts on the mother board connects to a transmission line on the daughter board and then connects back to the mother board. The combination of the terminations, the line segments on the mother board and the loop-through lines on the daughter boards form a complete terminated bus line. The transceivers 7 are mounted on the daughter boards and are electrically connected between the loop-through lines at connection points 11 and the daughter board circuit functions 8. The transceivers isolate the connections between the transceivers and the daughter board circuit functions 8 from the complete terminated bus lines. The stubs 21 between the controlled impedance line on the daughter board and the transceivers can be made short as with the active backplane.

The only impedance mismatches are at the connectors and at the stubs 21. Since there are two connections per daughter board, connector quality is a major factor in performance. This architecture will not be quite as fast as the active backplane which has no removable connections on the backplane transmission line but will have much higher performance than the conventional backplane architecture. There are no active components on the motherboard. If a transceiver fails, the daughter board can be removed easily to be repaired or replaced.

Note that a daughter board needs to be present at each motherboard connector to form a complete terminated bus line. Daughter boards with only a connector and controlled impedance lines can be used as place holders to allow for later system expansion. Reliable connectors must be used since one bad connection to one daughter board effects the operation of the entire bus line. With the other architectures, a connection failure will only effect the communication between the daughter board with the failed connection and not the communications among all of the other daughter boards.

Figure 5:
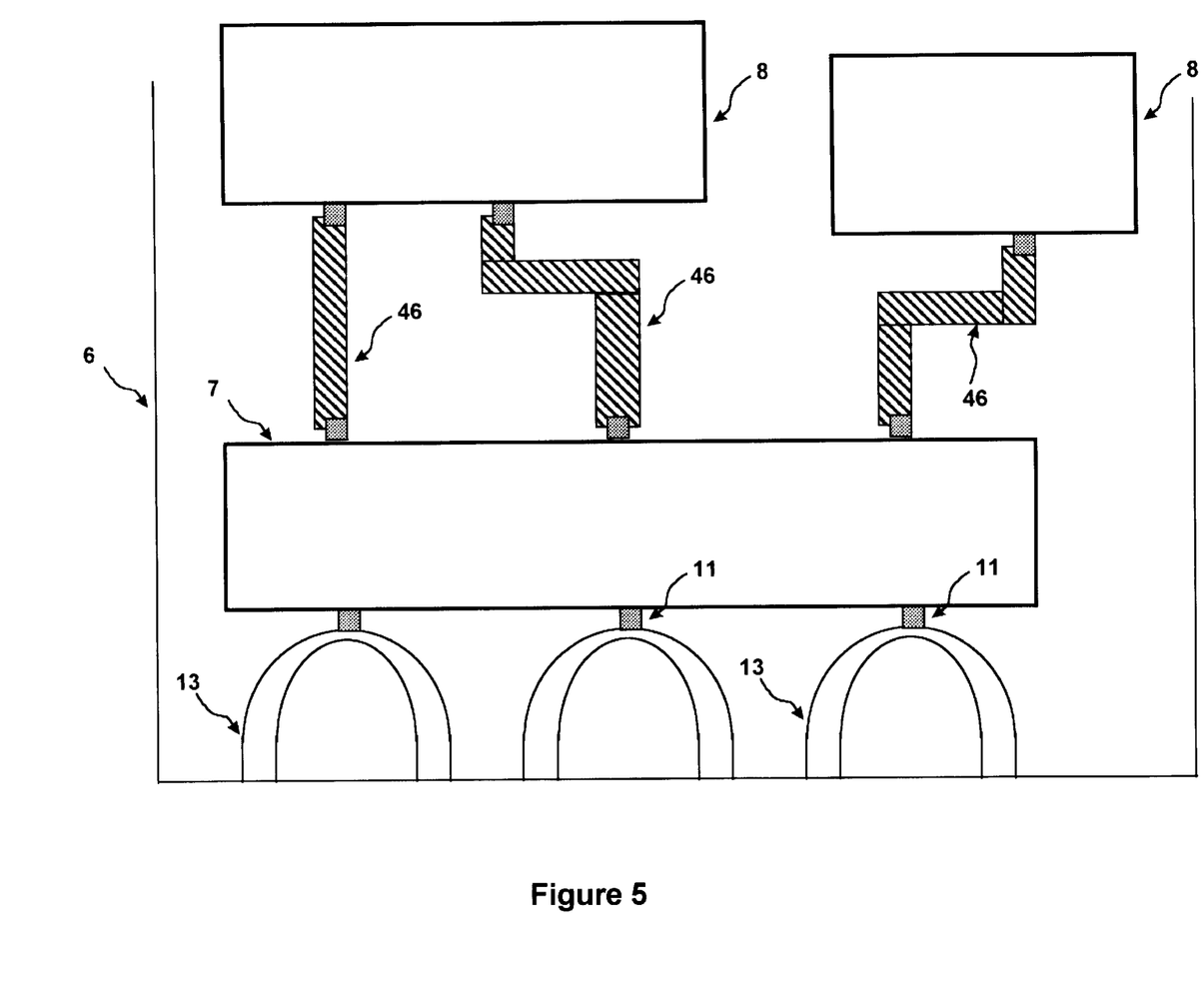
FIG. 5 is a top view of a portion of a daughter board for the loop-through backplane.

FIG. 5 shows a top view of a portion of a daughter board for the loop-through backplane. The daughter board 6 contains a transceiver circuit 7, daughter board circuit functions 8, signal lines 46 connecting the transceiver to the circuit functions, and loop-through transmission lines 13 which are narrowed near the connection to the transceiver at point 11 to compensate for the additional capacitance of the transceiver. This daughter board mates with an edge card connector on the mother board.

Loop-Through Backplane with Active Connectors

Figure 6:
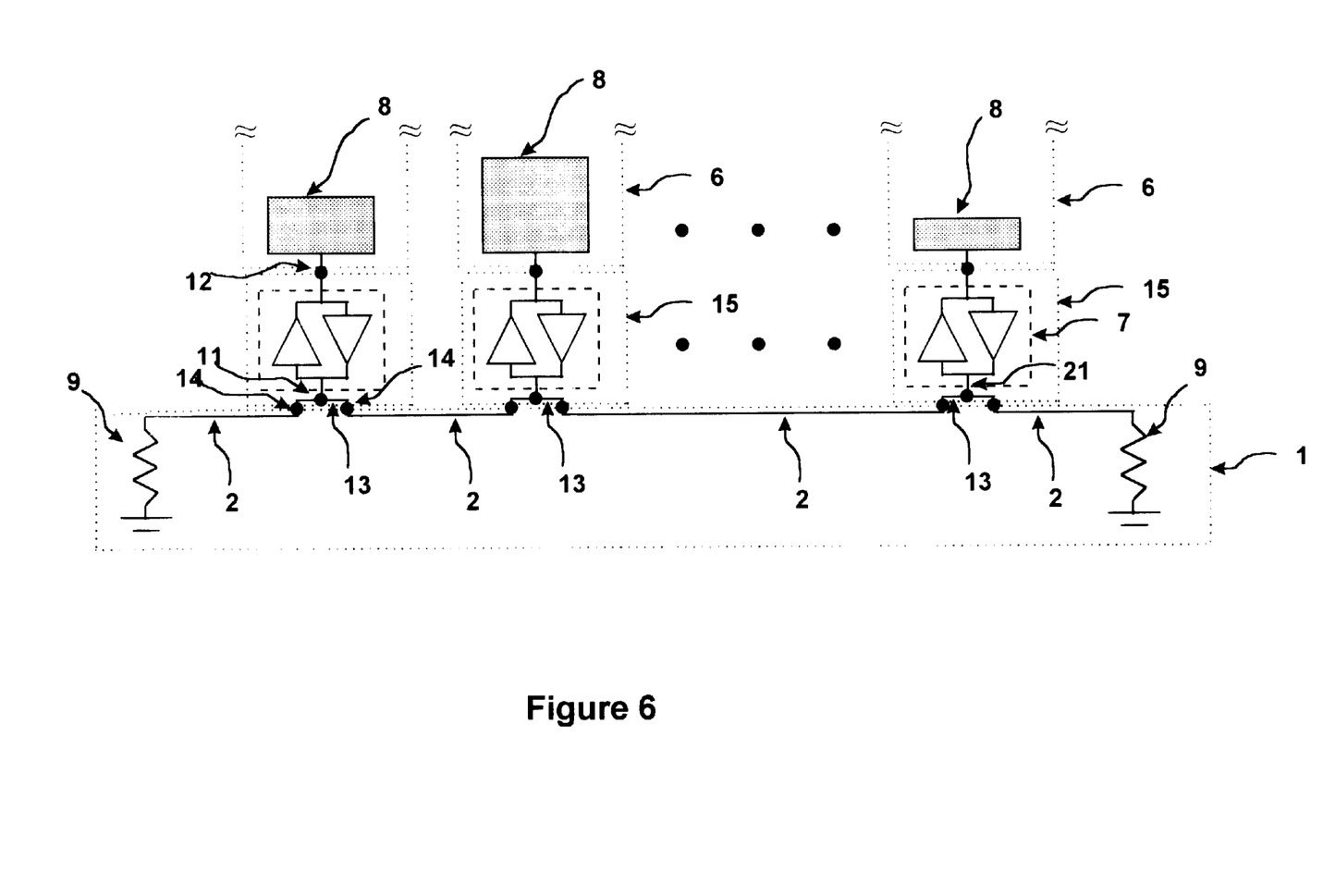
FIG. 6 is a schematic of the loop-through backplane with active connectors.

The loop-through backplane can be improved with the use of active connectors containing loop-through lines connecting to the mother board, transceivers electrically connected between the loop-through lines and the connector contacts to the daughter board. A schematic of the active loop-through connector backplane approach is shown in FIG. 6. Only one line is shown. The backplane consists of a mother board 1 with controlled impedance bus line segments 2 between several active connectors 15. The two end segments are terminated by terminations 9. Each active connector contains a loop-through controlled impedance line 13 per bus line which contacts two different bus line segments at connector contact points 14. The combination of the terminations, the line segments on the mother board and the loop-through lines on the daughter boards form a complete terminated bus line. The transceivers 7 are mounted on the connectors and are electrically connected between the loop-through lines at connection points 11 and daughter board connector contact points 12. The stubs 21 between the controlled impedance line on the daughter board and the transceivers can be made short as with the active backplane. The transceivers isolate the connections between the transceivers and the daughter board circuit functions 8 from the complete terminated bus lines removing the constraint that the signal path between the transceiver and the daughter board components needs to be short. Only one removable contact 12 is in the path between the transceiver and the daughter board components easing the required precision the controlled impedance of the connectors.

Unlike the loop-through backplane, unpopulated daughter boards or contact failures at the daughter board contacts 12 do not effect the communication between other daughter boards.

The preferred embodiment for mounting the active loop-through connector to the motherboard is with screws. The active loop-through connector must be fastened securely to provide reliable operation with repeated removal and insertion of daughter boards. It only needs to be removed infrequently for repair or replacement of the transceivers or possibly contact wear. Mounting with screws also allows the connector to be removed and replaced without removing any other boards.

A preferred embodiment of the invention for the connection between the active loop-through connector and the mother board is with conductive elastomers. Connections using conductive elastomers can have controlled impedance for high data rates and provide high-density connections.

Figure 7:
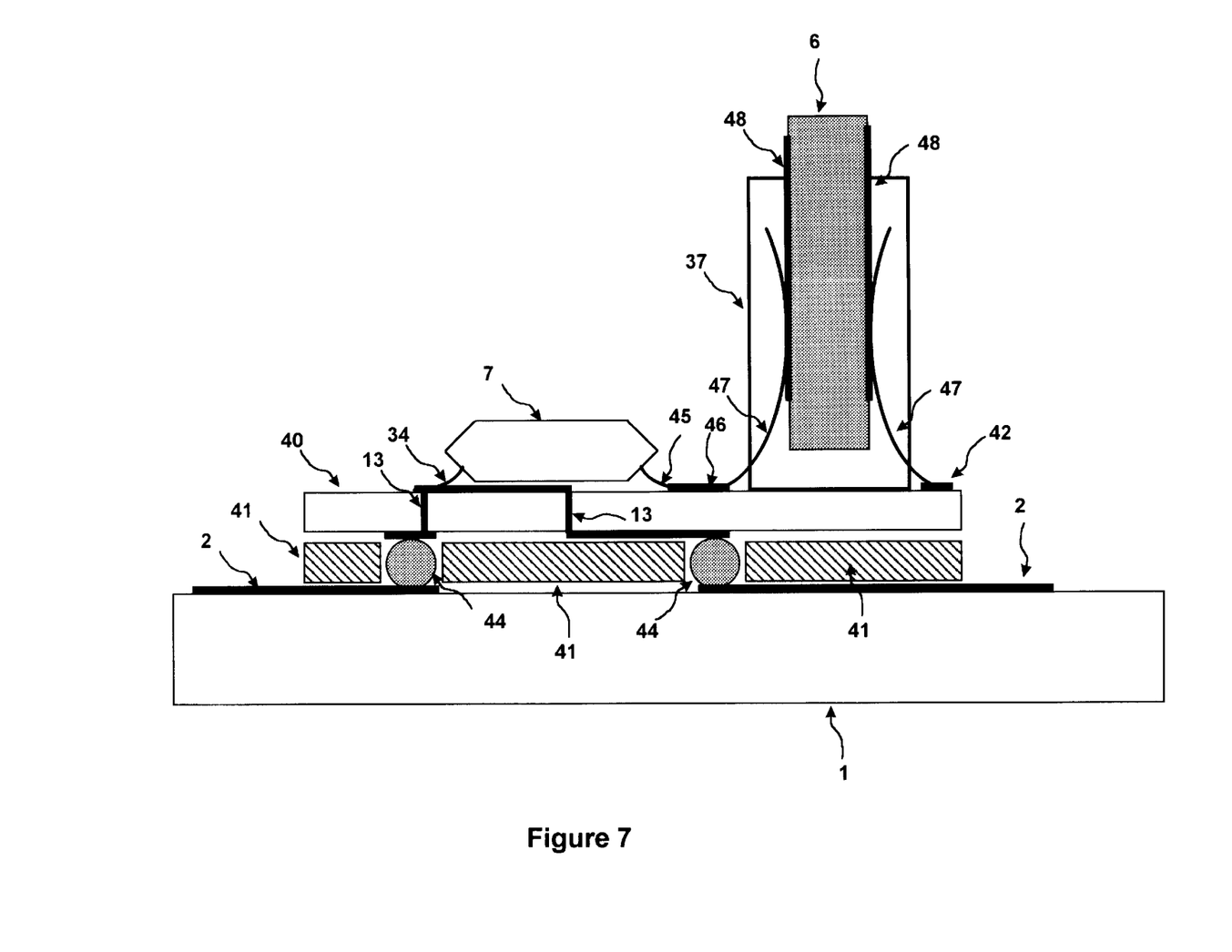
FIG. 7 is a sectional view an active connector on a loop-through backplane.

FIG. 7 is a sectional view of the preferred embodiment of an active connector on a loop-through backplane. The active connector consists of a circuit board 40 on which is mounted a card-edge connector 37 which mates with the daughter board 6 so that signal paths 48 on the daughter board electrically connect to contacts 47 on the card-edge connector, two conductive elastomers 44 to connect the loop-through signal lines 13 to a pair of bus line segments 2 on the mother board 1, spacer material 41 to insure that the elastomers are properly positioned and receive the proper pressure for good contact, transceivers 7 whose one set of leads 34 connect to the loop-through transmission line 13 and the other set of leads 45 connecting to signal path 46 which connect to the card-edge connector contacts 47, and signal paths 42 which carry power and other lower-speed signals that do not connect to the transceiver 7.

Figure 8:
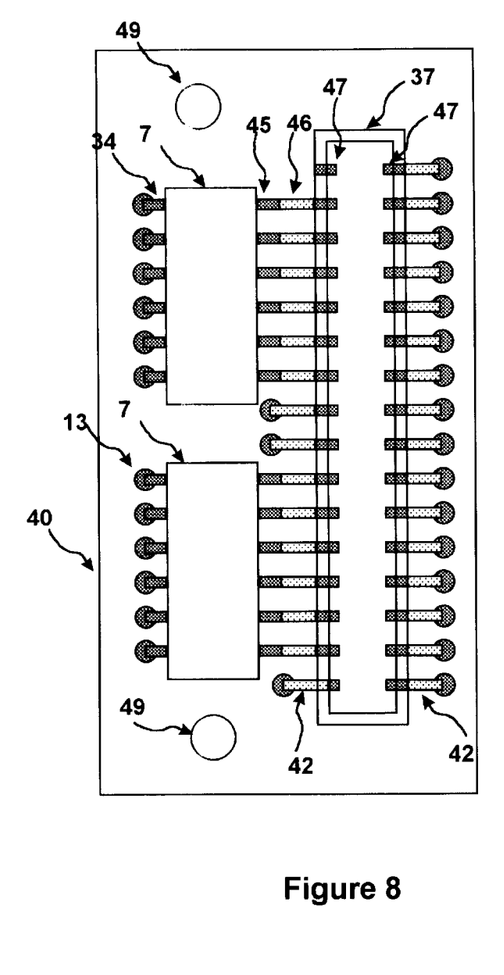
FIG. 8 is a top view of the active connector in FIG. 7.

FIG. 8 is a top view of the active connector in FIG. 7 This figure shows how multiple transceiver integrated circuits 7 can be connected to the signals, and two screw holes 49 for mounting the connector to the mother board.

There are impedance mismatches where transceivers are connected which cause reflections and limit the maximum data rates for the loop-through and active backplane architectures.

Figure 9:
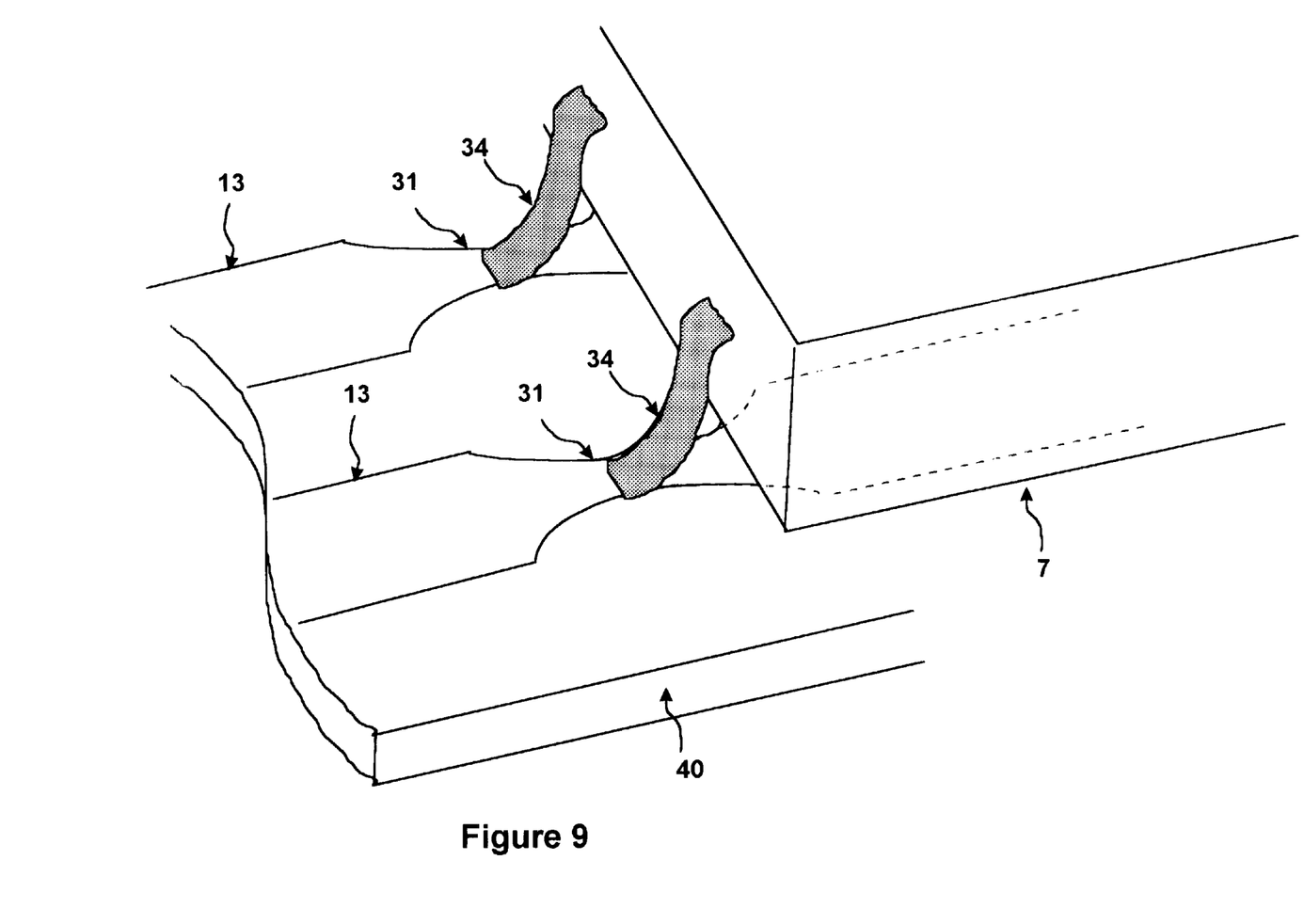
FIG. 9 is a perspective illustration of a section of transmission line that has been narrowed to compensate for the added capacitance of the transceiver.

A major limitation on high performance is reflections caused by the capacitance of the transceiver. Using the lowest capacitance transceiver available minimizes reflections but performance can be increased beyond this by compensating for this capacitance during transmission line design. The preferred embodiment is to narrow the transmission line near the transceiver to increase its impedance (lower its capacitance) locally. When the reduced capacitance matches the lumped capacitance of the transceiver, the average impedance of the line will be brought back to its original value. There will still be line discontinuities but because the distance over which they exist and the impedance mismatches are small only the highest frequency edges will be affected. An alternative to narrowing the transmissions line is to add inductance locally to raise the impedance. Then, adding the transceiver will lower the impedance back to its nominal value. A combination of reducing capacitance and increasing inductance is also possible. FIG. 9 illustrates a section of transmission line that has been narrowed to compensate for the added capacitance of the transceiver. The transmission lines 13 on substrate 40 are narrowed at 31 where they make contact to leads 34 of transceiver integrated circuit 7. The impedance of the lines are higher where they are narrowed to compensate for the additional capacitance of the leads.

Figure 10:
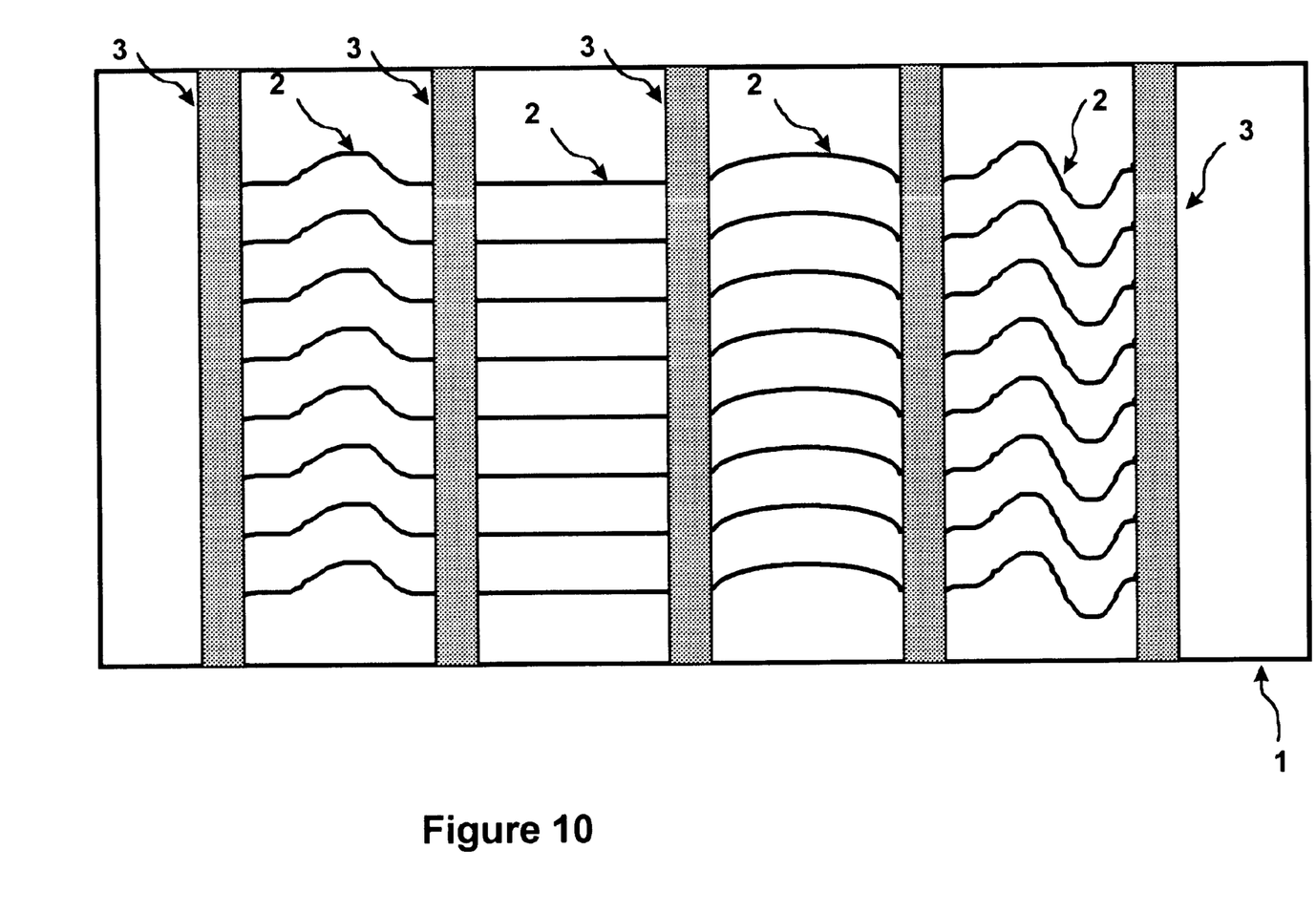
FIG. 10 is a top view of a motherboard with attached connectors where the electrical lengths of the bus line segments are different.

The transceivers on a backplane are connected at regular intervals. Because of this, reflections from two different transceivers connections, taking two different paths, add together at other transceiver locations. By spacing the transceivers at non-equal electrical intervals, the coherent addition of reflections can be prevented which increases the performance of the backplane. The transceivers can be placed physically at equal intervals with the intervening transmission lines being different lengths. FIG. 10 shows a top view of a backplane 1 with 8 bus lines 2 connecting to mother board connectors 3 where the lengths of the bus line segments are different. The electrical signals traveling along the transmission lines will have varying delays through different segments. With careful choices of the lengths, the coherent addition of reflections can be reduced.

In summary, the loop-through and the loop-through with active connectors backplane architectures provide much higher performance than the conventional backplane architecture without the difficulty of repair of the active backplane architecture. The performance of active loop-through connector backplanes, active backplanes or loop-through backplanes can be increased by compensating for the transceiver capacitance by increasing the impedance locally so the average line impedance matches the backplane line impedance, and by placing the transceivers at irregular electrical distances to eliminate coherent addition of reflections at transceiver nodes.

The preceding and further advantages will appear to those skilled in the art upon a reading of the foregoing specification. While the preferred embodiments of the invention have been illustrated and described, variations will be apparent to those skilled in the art. Accordingly, the invention is not to be limited to the specific embodiments illustrated and described, and the true scope of the invention is to be determined by reference to the following claims.

What is claimed:

1. A connector for coupling a daughter board having a plurality of conductive paths to a motherboard having a plurality of conductive segmented lines, said connector comprising:
    a body coupleable to the motherboard and to the daughter board;
    a plurality of loop-through paths in the body for connecting a pair of segments on the mother board and providing a conductive path between said pair of segments; and
    a plurality of active circuit elements each of which are electrically connected between at least one of the plurality of loop-through paths and providing a conductive path to the daughter board.

2. The connector of claim 1 wherein said loop-through paths are of varying widths to compensate for parasitic capacitances and inductances associated with the transceiver and the connection of the transceiver to the loop-through paths.

3. The connector of claim 1 wherein the means of connecting the loop-through paths to a pair of segments on the mother board is a conductive elastomer.

4. A backplane for the purpose of interconnecting a plurality of daughter circuit boards, wherein each of the plurality of daughter circuit boards includes one or more conductive paths, the backplane comprising:
    a motherboard containing a plurality of segmented conducting electrical signals paths;
    a plurality of connectors containing conducting loop-through signal paths for connecting pairs of said segmented paths on said mother board together to form a plurality of bus lines;
    said means of connection between said connector and said motherboard to be removable;
    said connector includes means for supporting at least one functioning electronic component;
    a means to connect said electronic component to said loop-through signal paths;
    a means to connect said electronic component to said conductive paths on said daughter circuit boards.

5. The backplane in claim 4 wherein the plurality of segmented conducting electrical signals paths are of different lengths.

6. A daughter board interface for the purpose of interconnecting a plurality of daughter circuit board signal paths to a motherboard having a plurality of connectors mounted on the mother board, said connectors connected to a plurality of conductive segmented lines on the motherboard, said daughter board interface comprising:
    a plurality of loop-through paths on the daughter board for connecting a pair of segments on the mother board and providing a conductive path between said pair of segments; and
    a plurality of active circuit elements each of which are electrically connected between at least one of the plurality of loop-through paths and at least on of the plurality of daughter circuit board signal paths.

* * * * *